US008014534B2

(12) United States Patent
Henn et al.

(10) Patent No.: US 8,014,534 B2
(45) Date of Patent: Sep. 6, 2011

(54) EFFICIENT AND SCALABLE PARAMETRIC STEREO CODING FOR LOW BITRATE AUDIO CODING APPLICATIONS

(75) Inventors: Fredrik Henn, Bromma (SE); Kristofer Kjorling, Solna (SE); Lars Liljeryd, Solna (SE); Jonas Roden, Solna (SE); Jonas Engdegard, Stockholm (SE)

(73) Assignee: Coding Technologies AB, Stockholm (SE)

( * ) Notice: Subject to any disclaimer, the term of this patent is extended or adjusted under 35 U.S.C. 154(b) by 1450 days.

(21) Appl. No.: 11/237,174

(22) Filed: Sep. 27, 2005

(65) Prior Publication Data

US 2006/0029231 A1 Feb. 9, 2006

Related U.S. Application Data

(62) Division of application No. 10/483,453, filed as application No. PCT/SE02/01372 on Jul. 10, 2002, now Pat. No. 7,382,886.

(30) Foreign Application Priority Data

Jul. 10, 2001 (SE) ....................................... 0102481
Mar. 15, 2002 (SE) ....................................... 0200796
Jul. 9, 2002 (SE) ....................................... 0202159

(51) Int. Cl.
*H04R 5/00* (2006.01)
*H03G 7/00* (2006.01)

(52) U.S. Cl. ............................. 381/23; 381/22; 381/106

(58) Field of Classification Search .................... 381/23, 381/22, 106
See application file for complete search history.

(56) References Cited

U.S. PATENT DOCUMENTS 4,053,711 A 10/1977 DeFreitas et al.
4,166,924 A 9/1979 Berkley et al.
4,706,287 A 11/1987 Blackmer et al.
5,463,424 A 10/1995 Dressler
5,559,891 A 9/1996 Kuusama et al.
(Continued)

FOREIGN PATENT DOCUMENTS

DE 19947098 A1 11/2000
(Continued)

OTHER PUBLICATIONS

Herre, Jurgen, et al., "Intensity Stereo Coding," Feb. 26 1994, Preprints of Papers Presented at the Audio Engineering Society Convention, XP009025131, vol. 96, No. 3799, pp. 1-10.

(Continued)

*Primary Examiner* — Vivian Chin
*Assistant Examiner* — Douglas Suthers
(74) *Attorney, Agent, or Firm* — Michael A. Glenn; Glenn Patent Group

(57) ABSTRACT

The present invention provides improvements to prior art audio codecs that generate a stereo-illusion through post-processing of a received mono signal. These improvements are accomplished by extraction of stereo-image describing parameters at the encoder side, which are transmitted and subsequently used for control of a stereo generator at the decoder side. Furthermore, the invention bridges the gap between simple pseudo-stereo methods, and current methods of true stereo-coding, by using a new form of parametric stereo coding. A stereo-balance parameter is introduced, which enables more advanced stereo modes, and in addition forms the basis of a new method of stereo-coding of spectral envelopes, of particular use in systems where guided HFR (High Frequency Reconstruction) is employed. As a special case, the application of this stereo-coding scheme in scalable HFR-based codecs is described.

7 Claims, 4 Drawing Sheets

U.S. PATENT DOCUMENTS

| | | | |
|---|---|---|---|
| 5,613,035 | A | 3/1997 | Kim |
| 5,671,287 | A | 9/1997 | Gerzon |
| 5,701,346 | A | 12/1997 | Herre et al. |
| 5,862,228 | A | 1/1999 | Davis |
| 5,873,065 | A | 2/1999 | Akagiri et al. |
| 5,883,962 | A | 3/1999 | Hawks |
| 5,890,108 | A | 3/1999 | Yeldener |
| 5,890,125 | A | 3/1999 | Davis et al. |
| 6,507,658 | B1 | 1/2003 | Abel et al. |
| 6,771,777 | B1 | 8/2004 | Gbur et al. |
| 2002/0037086 | A1 | 3/2002 | Irwan et al. |

FOREIGN PATENT DOCUMENTS

| | | | |
|---|---|---|---|
| EP | 0478096 | A2 | 1/1987 |
| EP | 0 273 567 | A1 | 7/1988 |
| EP | 0858067 | A2 | 8/1998 |
| EP | 0918407 | A2 | 5/1999 |
| EP | 0 989 543 | A2 | 3/2000 |
| EP | 1 107 232 | A2 | 6/2001 |
| EP | 1107232 | | 6/2001 |
| GB | 2100430 | A | 12/1982 |
| JP | H02-012299 | | 1/1990 |
| JP | 2-177782 | | 7/1990 |
| JP | 3-214956 | | 9/1991 |
| JP | H04-301688 | | 10/1992 |
| JP | H05-165500 | | 7/1993 |
| JP | H06-090209 | | 3/1994 |
| JP | H06-202629 | | 7/1994 |
| JP | H06-215482 | | 8/1994 |
| JP | H08-254994 | | 10/1996 |
| JP | H08-305398 | | 11/1996 |
| JP | 9-500252 | | 1/1997 |
| JP | 9-501286 | | 2/1997 |
| JP | H09-505193 | | 5/1997 |
| JP | H09-261064 | | 10/1997 |
| JP | H11-262100 | | 9/1999 |
| JP | 11-317672 | A | 11/1999 |
| JP | 2000-083014 | | 3/2000 |
| JP | 2000-505266 | | 4/2000 |
| JP | 2001-184090 | | 7/2001 |
| JP | 2004-535145 | | 11/2004 |
| KR | 96-003455 | | 3/1996 |
| KR | 96-0012475 | | 9/1996 |
| WO | WO 98/03036 | | 1/1998 |
| WO | WO 98-03037 | | 1/1998 |
| WO | WO98/57436 | | 12/1998 |
| WO | WO 00/45378 | A | 8/2000 |
| WO | WO 03/007656 | A1 | 1/2003 |

OTHER PUBLICATIONS

Bauer, D., Examinations Regarding the Similarity of Digital Stereo Signals in High Quality Music Reproduction; University of Erlangen-Neurnberg, 1991.

Dutilleux, Pierre; "Filters, Delays, Modulations and Demodulations: A Tutorial"; [online] no publication can be found [retrieved on Feb. 19, 2009], retrieved from internet address: http://on1.akm.de/skm/Instiute/Musik/SKMusik/veroeffentlicht/PD_Filters.

McNally, G.W.; "Dynamic Range Control of Digital Audio Signals"; May 1984; Journal of Audio Engineering Society, vol. 32, No. 5, pp. 316-327.

Zolzer, Udo; "Digital Audio Signal Processing"; 1997; pp. 207-247; John Wiley & Sons Ltd., England.

Chen, S. and R. Rosenfeld; A Survey of Smoothing Techniques for ME Models; Jan. 2000, IEEE.

Proakis and Monolakic; Digital Signal Processing, 1996.

George, et al.; "Analysis-by-Synthesis/Overlap-Add Sinusoidal Modeling Applied to the Analysis and Synthesis of Musical Tones"; Jun. 1992; Journal of Audio Engineering Society, vol. 40, No. 6, 20 pages.

Proakis and Monolakic; "Digital Signal Processing", 1996, pp. 771-773; submitted with a Declaration 1.132.

Japanese Office Action mailed Apr. 27, 2010 in related Japanese patent application No. 2005-289552, 12 pages.

Japanese Questioning Communication mailed May 25, 2010 in related Japanese patent application No. 2005-289554, 7 pages.

EFFICIENT AND SCALABLE PARAMETRIC STEREO CODING FOR LOW BITRATE AUDIO CODING APPLICATIONS

CROSS REFERENCE TO RELATED APPLICATIONS

This application is a divisional application of U.S. Ser. No. 10/483,453 filed Jan. 8, 2004, now U.S. Pat. No. 7,382,886, which is a National Stage Entry of PCT/SE02/01372, filed on Jul. 10, 2002, which claims priority to Swedish patent application no. 0202159-0, filed on Jul. 9, 2002, Swedish patent application no. 0200796-1, filed on Mar. 15, 2002, and Swedish patent application no. 0102481-9, filed on Jul. 10, 2001.

TECHNICAL FIELD

The present invention relates to low bitrate audio source coding systems. Different parametric representations of stereo properties of an input signal are introduced, and the application thereof at the decoder side is explained, ranging from pseudo-stereo to full stereo coding of spectral envelopes, the latter of which is especially suited for HFR based codecs.

BACKGROUND OF THE INVENTION

Audio source coding techniques can be divided into two classes: natural audio coding and speech coding. At medium to high bitrates, natural audio coding is commonly used for speech and music signals, and stereo transmission and reproduction is possible. In applications where only low bitrates are available, e.g. Internet streaming audio targeted at users with slow telephone modem connections, or in the emerging digital AM broadcasting systems, mono coding of the audio program material is unavoidable. However, a stereo impression is still desirable, in particular when listening with headphones, in which case a pure mono signal is perceived as originating from "within the head", which can be an unpleasant experience.

One approach to address this problem is to synthesize a stereo signal at the decoder side from a received pure mono signal. Throughout the years, several different "pseudo-stereo" generators have been proposed. For example in [U.S. Pat. No. 5,883,962], enhancement of mono signals by means of adding delayed/phase shifted versions of a signal to the unprocessed signal, thereby creating a stereo illusion, is described. Hereby the processed signal is added to the original signal for each of the two outputs at equal levels but with opposite signs, ensuring that the enhancement signals cancel if the two channels are added later on in the signal path. In [PCT WO 98/57436] a similar system is shown, albeit without the above mono-compatibility of the enhanced signal. Prior art methods have in common that they are applied as pure post-processes. In other words, no information on the degree of stereo-width, let alone position in the stereo sound stage, is available to the decoder. Thus, the pseudo-stereo signal may or may not have a resemblance of the stereo character of the original signal. A particular situation where prior art systems fall short, is when the original signal is a pure mono signal, which often is the case for speech recordings. This mono signal is blindly converted to a synthetic stereo signal at the decoder, which in the speech case often causes annoying artifacts, and may reduce the clarity and speech intelligibility.

Other prior art systems, aiming at true stereo transmission at low bitrates, typically employ a sum and difference coding scheme. Thus, the original left (L) and right (R) signals are converted to a sum signal, $S=(L+R)/2$, and a difference signal, $D=(L-R)/2$, and subsequently encoded and transmitted. The receiver decodes the S and D signals, whereupon the original L/R-signal is recreated through the operations $L=S+D$, and $R=S-D$. The advantage of this, is that very often a redundancy between L and R is at hand, whereby the information in D to be encoded is less, requiring fewer bits, than in S. Clearly, the extreme case is a pure mono signal, i.e. L and R are identical. A traditional L/R-codec encodes this mono signal twice, whereas a S/D codec detects this redundancy, and the D signal does (ideally) not require any bits at all. Another extreme is represented by the situation where $R=-L$, corresponding to "out of phase" signals. Now, the S signal is zero, whereas the D signal computes to L. Again, the S/D-scheme has a clear advantage to standard L/R-coding. However, consider the situation where e.g. $R=0$ during a passage, which was not uncommon in the early days of stereo recordings. Both S and D equal L/2, and the S/D-scheme does not offer any advantage. On the contrary, L/R-coding handles this very well: The R signal does not require any bits. For this reason, prior art codecs employ adaptive switching between those two coding schemes, depending on what method that is most beneficial to use at a given moment. The above examples are merely theoretical (except for the dual mono case, which is common in speech only programs). Thus, real world stereo program material contains significant amounts of stereo information, and even if the above switching is implemented, the resulting bitrate is often still too high for many applications. Furthermore, as can be seen from the resynthesis relations above, very coarse quantization of the D signal in an attempt to further reduce the bitrate is not feasible, since the quantization errors translate to non-neglectable level errors in the L and R signals.

SUMMARY OF THE INVENTION

The present invention employs detection of signal stereo properties prior to coding and transmission. In the simplest form, a detector measures the amount of stereo perspective that is present in the input stereo signal. This amount is then transmitted as a stereo width parameter, together with an encoded mono sum of the original signal. The receiver decodes the mono signal, and applies the proper amount of stereo-width, using a pseudo-stereo generator, which is controlled by said parameter. As a special case, a mono input signal is signaled as zero stereo width, and correspondingly no stereo synthesis is applied in the decoder. According to the invention, useful measures of the stereo-width can be derived e.g. from the difference signal or from the cross-correlation of the original left and right channel. The value of such computations can be mapped to a small number of states, which are transmitted at an appropriate fixed rate in time, or on an as-needed basis. The invention also teaches how to filter the synthesized stereo components, in order to reduce the risk of unmasking coding artifacts which typically are associated with low bitrate coded signals.

Alternatively, the overall stereo-balance or localization in the stereo field is detected in the encoder. This information, optionally together with the above width-parameter, is efficiently transmitted as a balance-parameter, along with the encoded mono signal. Thus, displacements to either side of the sound stage can be recreated at the decoder, by correspondingly altering the gains of the two output channels. According to the invention, this stereo-balance parameter can be derived from the quotient of the left and right signal powers. The transmission of both types of parameters requires very few bits compared to full stereo coding, whereby the total bitrate demand is kept low. In a more elaborate version of the invention, which offers a more accurate parametric stereo depiction, several balance and stereo-width parameters are used, each one representing separate frequency bands.

The balance-parameter generalized to a per frequency-band operation, together with a corresponding per band operation of a level-parameter, calculated as the sum of the left and right signal powers, enables a new, arbitrary detailed, representation of the power spectral density of a stereo signal. A particular benefit of this representation, in addition to the benefits from stereo redundancy that also S/D-systems take advantage of, is that the balance-signal can be quantized with less precision than the level ditto, since the quantization error, when converting back to a stereo spectral envelope, causes an "error in space", i.e. perceived localization in the stereo panorama, rather than an error in level. Analogous to a traditional switched L/R- and S/D-system, the level/balance-scheme can be adaptively switched off, in favor of a levelL/levelR-signal, which is more efficient when the overall signal is heavily offset towards either channel. The above spectral envelope coding scheme can be used whenever an efficient coding of power spectral envelopes is required, and can be incorporated as a tool in new stereo source codecs. A particularly interesting application is in HFR systems that are guided by information about the original signal highband envelope. In such a system, the lowband is coded and decoded by means of an arbitrary codec, and the highband is regenerated at the decoder using the decoded lowband signal and the transmitted highband envelope information [PCT WO 98/57436]. Furthermore, the possibility to build a scalable HFR-based stereo codec is offered, by locking the envelope coding to level/balance operation. Hereby the level values are fed into the primary bitstream, which, depending on the implementation, typically decodes to a mono signal. The balance values are fed into the secondary bitstream, which in addition to the primary bitstream is available to receivers close to the transmitter, taking an IBOC (In-Band On-Channel) digital AM-broadcasting system as an example. When the two bitstreams are combined, the decoder produces a stereo output signal. In addition to the level values, the primary bitstream can contain stereo parameters, e.g. a width parameter. Thus, decoding of this bitstream alone already yields a stereo output, which is improved when both bitstreams are available.

BRIEF DESCRIPTION OF THE DRAWINGS

The present invention will now be described by way of illustrative examples, not limiting the scope or spirit of the invention, with reference to the accompanying drawings, in which.

DESCRIPTION OF PREFERRED EMBODIMENTS

The below-described embodiments are merely illustrative for the principles of the present invention. It is understood that modifications and variations of the arrangements and the details described herein will be apparent to others skilled in the art. It is the intent therefore, to be limited only by the scope of the impending patent claims, and not by the specific details presented by way of description and explanation of the embodiments herein. For the sake of clarity, all below examples assume two channel systems, but apparent to others skilled in the art, the methods can be applied to multichannel systems, such as a 5.1 system.

Figure 1:
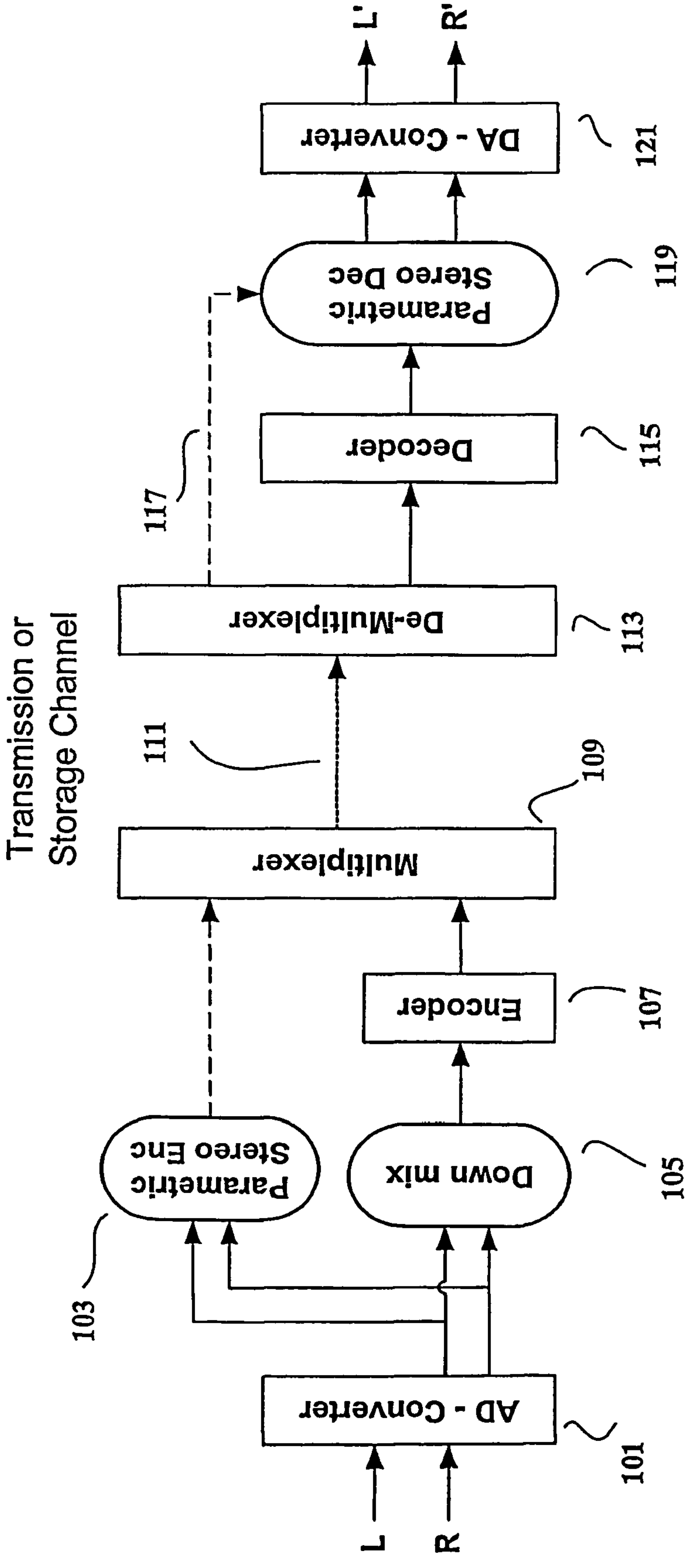
FIG. 1 illustrates a source coding system containing an encoder enhanced by a parametric stereo encoder module, and a decoder enhanced by a parametric stereo decoder module.

FIG. 1 shows how an arbitrary source coding system comprising of an encoder, 107, and a decoder, 115, where encoder and decoder operate in monaural mode, can be enhanced by parametric stereo coding according to the invention. Let L and R denote the left and right analog input signals, which are fed to an AD-converter, 101. The output from the AD-converter is converted to mono, 105, and the mono signal is encoded, 107. In addition, the stereo signal is routed to a parametric stereo encoder, 103, which calculates one or several stereo parameters to be described below. Those parameters are combined with the encoded mono signal by means of a multiplexer, 109, forming a bitstream, 111. The bitstream is stored or transmitted, and subsequently extracted at the decoder side by means of a demultiplexer, 113. The mono signal is decoded, 115, and converted to a stereo signal by a parametric stereo decoder, 119, which uses the stereo parameter(s), 117, as control signal(s). Finally, the stereo signal is routed to the DA-converter, 121, which feeds the analog outputs, L' and R'. The topology according to FIG. 1 is common to a set of parametric stereo coding methods which will be described in detail, starting with the less complex versions.

One method of parameterization of stereo properties according to the present invention, is to determine the original signal stereo-width at the encoder side. A first approximation of the stereo-width is the difference signal, D=L−R, since, roughly put, a high degree of similarity between L and R computes to a small value of D, and vice versa. A special case is dual mono, where L=R and thus D=0. Thus, even this simple algorithm is capable of detecting the type of mono input signal commonly associated with news broadcasts, in which case pseudo-stereo is not desired. However, a mono signal that is fed to L and R at different levels does not yield a zero D signal, even though the perceived width is zero. Thus, in practice more elaborate detectors might be required, employing for example cross-correlation methods. One should make sure that the value describing the left-right difference or correlation in some way is normalized with the total signal level, in order to achieve a level independent detector. A problem with the aforementioned detector is the case when mono speech is mixed with a much weaker stereo signal e.g. stereo noise or background music during speech-to-music/music-to-speech transitions. At the speech pauses the detector will then indicate a wide stereo signal. This is solved by normalizing the stereo-width value with a signal containing information of previous total energy level e.g., a peak decay signal of the total energy. Furthermore, to prevent the stereo-width detector from being trigged by high frequency noise or channel different high frequency distortion, the detector signals should be pre-filtered by a low-pass filter, typically with a cutoff frequency somewhere above a voice's second formant, and optionally also by a high-pass filter to avoid unbalanced signal-offsets or hum. Regardless of detector type, the calculated stereo-width is mapped to a finite set of values, covering the entire range, from mono to wide stereo.

Figure 2A:
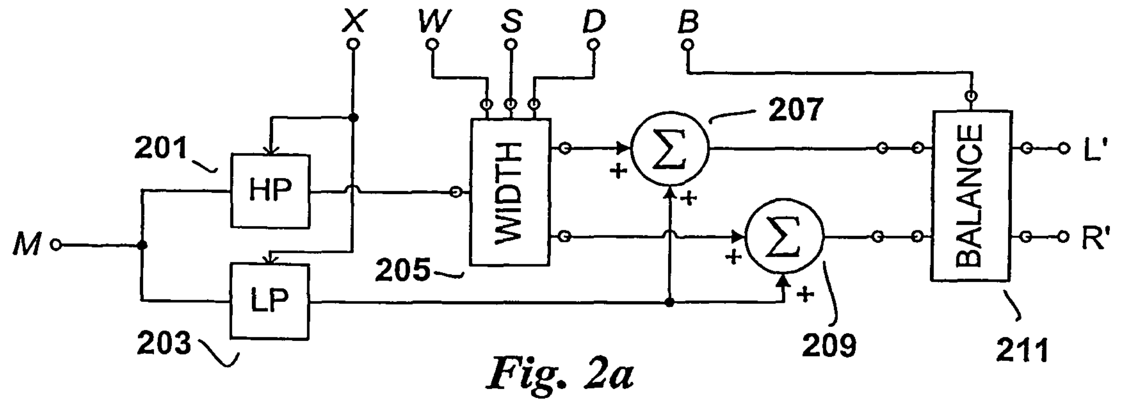
FIG. 2*a* is a block schematic of a parametric stereo decoder module.

FIG. 2*a* gives an example of the contents of the parametric stereo decoder introduced in FIG. 1. The block denoted 'balance', 211, controlled by parameter B, will be described later, and should be regarded as bypassed for now. The block denoted 'width', 205, takes a mono input signal and synthetically recreates the impression of stereo width, where the amount of width is controlled by the parameter W. The optional parameters S and D will be described later. According to the invention, a subjectively better sound quality can often be achieved by incorporating a crossover filter comprising of a low-pass filter, 203, and a high-pass filter, 201, in order to keep the low frequency range "tight" and unaffected. Hereby only the output from the high-pass filter is routed to the width block. The stereo output from the width block is added to the mono output from the low-pass filter by means of 207 and 209, forming the stereo output signal.

Figure 2B:
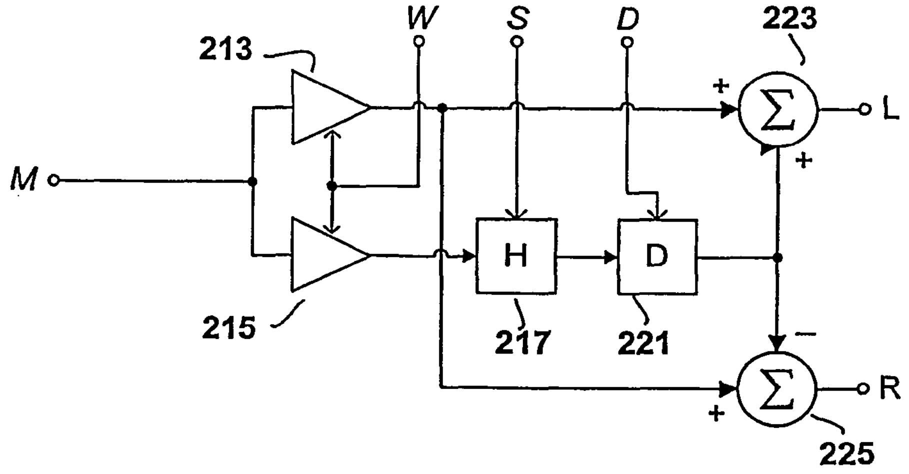
FIG. 2*b* is a block schematic of a pseudo-stereo generator with control parameter inputs.

Any prior art pseudo-stereo generator can be used for the width block, such as those mentioned in the background section, or a Schroeder-type early reflection simulating unit (multitap delay) or reverberator. FIG. 2*b* gives an example of a pseudo-stereo generator, fed by a mono signal M. The amount of stereo-width is determined by the gain of 215, and this gain is a function of the stereo-width parameter, W. The higher the gain, the wider the stereo-impression, a zero gain corresponds to pure mono reproduction. The output from 215 is delayed, 221, and added, 223 and 225, to the two direct signal instances, using opposite signs. In order not to significantly alter the overall reproduction level when changing the stereo-width, a compensating attenuation of the direct signal can be incorporated, 213. For example, if the gain of the delayed signal is G, the gain of the direct signal can be selected as $\mathrm{sqrt}(1-G^2)$. According to the invention, a high frequency roll-off can be incorporated in the delay signal path, 217, which helps avoiding pseudo-stereo caused unmasking of coding artifacts. Optionally, crossover filter, roll-off filter and delay parameters can be sent in the bitstream, offering more possibilities to mimic the stereo properties of the original signal, as also shown in FIGS. 2*a* and 2*b* as the signals X, S and D. If a reverberation unit is used for generating a stereo signal, the reverberation decay might sometimes be unwanted after the very end of a sound. These unwanted reverb-tails can however easily be attenuated or completely removed by just altering the gain of the reverb signal. A detector designed for finding sound endings can be used for that purpose. If the reverberation unit generates artifacts at some specific signals e.g., transients, a detector for those signals can also be used for attenuating the same.

An alternative method of detecting stereo-properties according to the invention, is described as follows. Again, let L and R denote the left and right input signals. The corresponding signal powers are then given by $P_L \sim L^2$ and $P_R \sim R^2$. Now, a measure of the stereo-balance can be calculated as the quotient of the two signal powers, or more specifically as $B=(P_L+e)/(P_R+e)$, where e is an arbitrary, very small number, which eliminates division by zero. The balance parameter, B, can be expressed in dB given by the relation $B_{dB}=10\log_{10}(B)$. As an example, the three cases $P_L=10P_R$, $P_L=P_R$, and $P_L=0.1P_R$ correspond to balance values of +10 dB, 0 dB, and −10 dB respectively. Clearly, those values map to the locations "left", "center", and "right". Experiments have shown that the span of the balance parameter can be limited to for example +/−40 dB, since those extreme values are already perceived as if the sound originates entirely from one of the two loudspeakers or headphone drivers. This limitation reduces the signal space to cover in the transmission, thus offering bitrate reduction. Furthermore, a progressive quantization scheme can be used, whereby smaller quantization steps are used around zero, and larger steps towards the outer limits, which further reduces the bitrate. Often the balance is constant over time for extended passages. Thus, a last step to significantly reduce the number of average bits needed can be taken: After transmission of an initial balance value, only the differences between consecutive balance values are transmitted, whereby entropy coding is employed. Very commonly, this difference is zero, which thus is signaled by the shortest possible codeword. Clearly, in applications where bit errors are possible, this delta coding must be reset at an appropriate time interval, in order to eliminate uncontrolled error propagation.

Figure 2C:
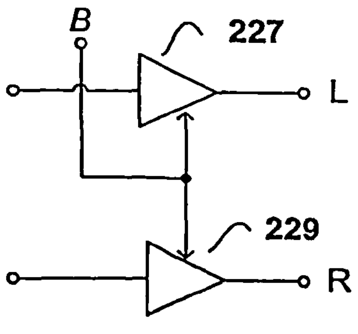
FIG. 2*c* is a block schematic of a balance adjuster with control parameter inputs.

The most rudimental decoder usage of the balance parameter, is simply to offset the mono signal towards either of the two reproduction channels, by feeding the mono signal to both outputs and adjusting the gains correspondingly, as illustrated in FIG. 2*c*, blocks 227 and 229, with the control signal B. This is analogous to turning the "panorama" knob on a mixing desk, synthetically "moving" a mono signal between the two stereo speakers.

The balance parameter can be sent in addition to the above described width parameter, offering the possibility to both position and spread the sound image in the sound-stage in a controlled manner, offering flexibility when mimicking the original stereo impression. One problem with combining pseudo stereo generation, as mentioned in a previous section, and parameter controlled balance, is unwanted signal contribution from the pseudo stereo generator at balance positions far from center position. This is solved by applying a mono favoring function on the stereo-width value, resulting in a greater attenuation of the stereo-width value at balance positions at extreme side position and less or no attenuation at balance positions close to the center position.

Figure 3:
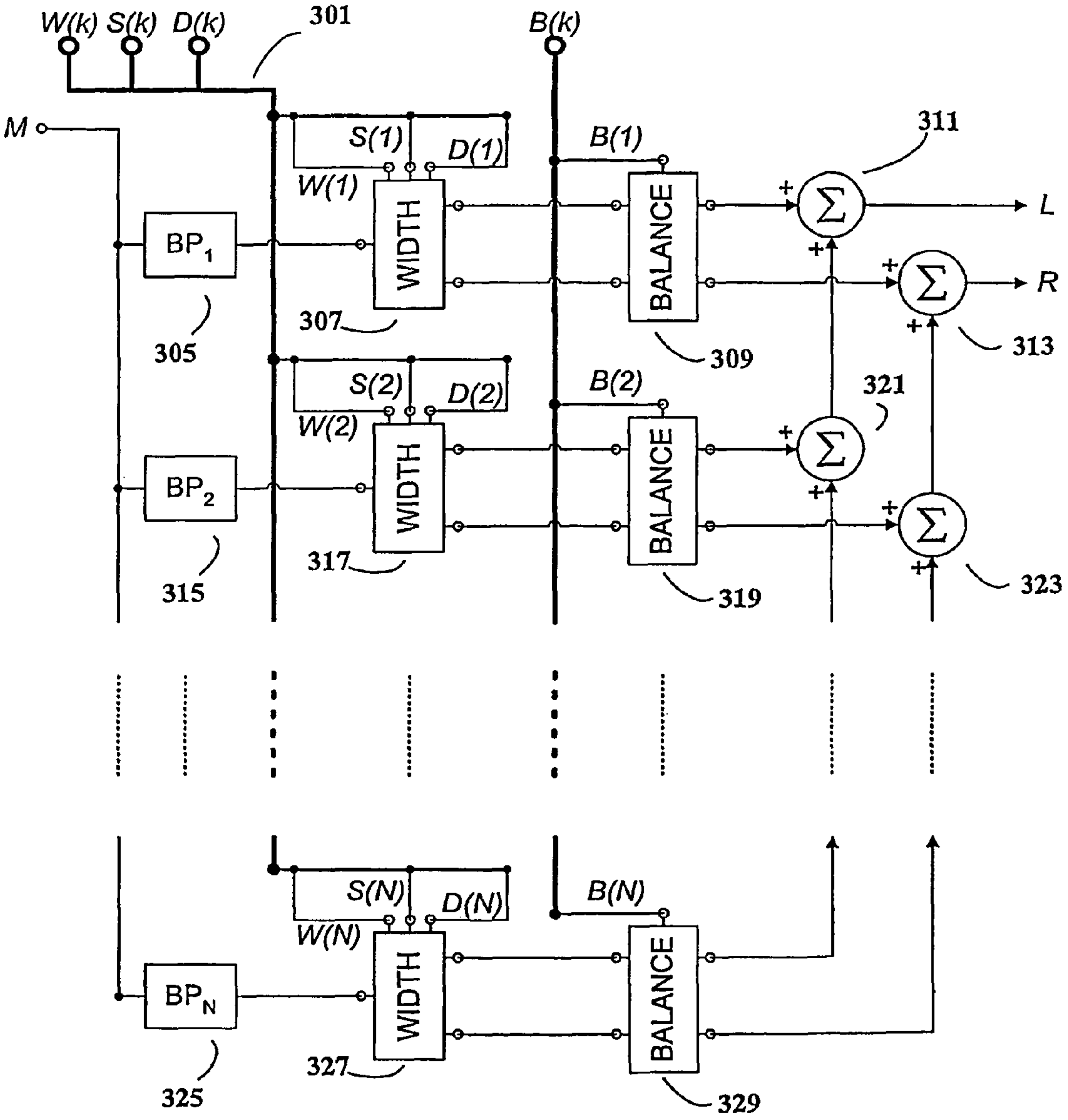
FIG. 3 is a block schematic of a parametric stereo decoder module using multiband pseudo-stereo generation combined with multiband balance adjustment.

The methods described so far, are intended for very low bitrate applications. In applications where higher bitrates are available, it is possible to use more elaborate versions of the above width and balance methods. Stereo-width detection can be made in several frequency bands, resulting in individual stereowidth values for each frequency band. Similarly, balance calculation can operate in a multiband fashion, which is equivalent to applying different filter-curves to two channels that are fed by a mono signal. FIG. 3 shows an example of a parametric stereo decoder 301 using a set of N pseudo-stereo generators according to FIG. 2*b*, represented by blocks 307, 317 and 327, combined with multiband balance adjustment, represented by blocks 309, 319 and 329, as described in FIG. 2*c*. The individual passbands are obtained by feeding the mono input signal, M. to a set of bandpass filters, 305, 315 and 325. The bandpass stereo outputs from the balance adjusters are added, 311. 321. 313, 323. forming the stereo output signal, L and R. The formerly scalar width- and balance parameters are now replaced by the arrays W(k) and B(k). In FIG. 3, every pseudo-stereo generator and balance adjuster has unique stereo parameters. However, in order to reduce the total amount of data to be transmitted or stored, parameters from several frequency bands can be averaged in groups at the encoder, and this smaller number of parameters be mapped to the corresponding groups of width and balance blocks at the decoder. Clearly, different grouping schemes and lengths can be used for the arrays W(k) and B(k). S(k) represents the gains of the delay signal paths in the width blocks, and D(k) represents the delay parameters. Again, S(k) and D(k) are optional in the bitstream.

The parametric balance coding method can, especially for lower frequency bands, give a somewhat unstable behavior, due to lack of frequency resolution, or due to too many sound events occurring in one frequency band at the same time but at different balance positions. Those balance-glitches are usually characterized by a deviant balance value during just a short period of time, typically one or a few consecutive values calculated, dependent on the update rate. In order to avoid disturbing balance-glitches, a stabilization process can be applied on the balance data. This process may use a number of balance values before and after current time position, to calculate the median value of those. The median value can subsequently be used as a limiter value for the current balance value i.e., the current balance value should not be allowed to go beyond the median value. The current value is then limited by the range between the last value and the median value. Optionally, the current balance value can be allowed to pass the limited values by a certain overshoot factor. Furthermore, the overshoot factor, as well as the number of balance values used for calculating the median, should be seen as frequency dependent properties and hence be individual for each frequency band.

At low update ratios of the balance information, the lack of time resolution can cause failure in synchronization between motions of the stereo image and the actual sound events. To improve this behavior in terms of synchronization, an interpolation scheme based on identifying sound events can be used. Interpolation here refers to interpolations between two, in time consecutive balance values. By studying the mono signal at the receiver side, information about beginnings and ends of different sound events can be obtained. One way is to detect a sudden increase or decrease of signal energy in a particular frequency band. The interpolation should after guidance from that energy envelope in time make sure that the changes in balance position should be performed preferably during time segments containing little signal energy. Since human ear is more sensitive to entries than trailing parts of a sound, the interpolation scheme benefits from finding the beginning of a sound by e.g., applying peak-hold to the energy and then let the balance value increments be a function of the peak-holded energy, where a small energy value gives a large increment and vice versa. For time segments containing uniformly distributed energy in time i.e., as for some stationary signals, this interpolation method equals linear interpolation between the two balance values. If the balance values are quotients of left and right energies, logarithmic balance values are preferred, for left-right symmetry reasons. Another advantage of applying the whole interpolation algorithm in the logarithmic domain is the human ear's tendency of relating levels to a logarithmic scale.

Also, for low update ratios of the stereo-width gain values, interpolation can be applied to the same. A simple way is to interpolate linearly between two in time consecutive stereo-width values. More stable behavior of the stereo-width can be achieved by smoothing the stereo-width gain values over a longer time segment containing several stereo-width parameters. By utilizing smoothing with different attack and release time constants, a system well suited for program material containing mixed or interleaved speech and music is achieved. An appropriate design of such smoothing filter is made using a short attack time constant, to get a short rise-time and hence an immediate response to music entries in stereo, and a long release time, to get a long fall-time. To be able to fast switch from a wide stereo mode to mono, which can be desirable for sudden speech entries, there is a possibility to bypass or reset the smoothing filter by signaling this event. Furthermore, attack time constants, release time constants and other smoothing filter characteristics can also be signaled by an encoder.

For signals containing masked distortion from a psychoacoustical codec, one common problem with introducing stereo information based on the coded mono signal is an unmasking effect of the distortion. This phenomenon usually referred as "stereo-unmasking" is the result of non-centered sounds that do not fulfill the masking criterion. The problem with stereo-unmasking might be solved or partly solved by, at the decoder side, introducing a detector aimed for such situations. Known technologies for measuring signal to mask ratios can be used to detect potential stereo-unmasking. Once detected, it can be explicitly signaled or the stereo parameters can just simply be decreased.

At the encoder side, one option, as taught by the invention, is to employ a Hilbert transformer to the input signal, i.e. a 90 degree phase shift between the two channels is introduced. When subsequently forming the mono signal by addition of the two signals, a better balance between a center-panned mono signal and "true" stereo signals is achieved, since the Hilbert transformation introduces a 3 dB attenuation for center information. In practice, this improves mono coding of e.g. contemporary pop music, where for instance the lead vocals and the bass guitar commonly is recorded using a single mono source.

The multiband balance-parameter method is not limited to the type of application described in FIG. 1. It can be advantageously used whenever the objective is to efficiently encode the power spectral envelope of a stereo signal. Thus, it can be used as tool in stereo codecs, where in addition to the stereo spectral envelope a corresponding stereo residual is coded. Let the total power P, be defined by $P=P_L+P_R$, where $P_L$ and $P_R$ are signal powers as described above. Note that this definition does not take left to right phase relations into account. (E.g. identical left and right signals but of opposite signs, does not yield a zero total power.) Analogous to B, P can be expressed in dB as $P_{dB}=10\log_{10}(P/P_{ref})$, where $P_{ref}$ is an arbitrary reference power, and the delta values be entropy coded. As opposed to the balance case, no progressive quantization is employed for P. In order to represent the spectral envelope of a stereo signal, P and B are calculated for a set of frequency bands, typically, but not necessarily, with bandwidths that are related to the critical bands of human hearing. For example those bands may be formed by grouping of channels in a constant bandwidth filterbank, whereby $P_L$ and $P_R$ are calculated as the time and frequency averages of the squares of the subband samples corresponding to respective band and period in time. The sets $P_0, P_1, P_2, \ldots, P_{N-1}$ and $B_0, B_1, B_2, \ldots, B_{N-1}$, where the subscripts denote the frequency band in an N band representation, are delta and Huffman coded, transmitted or stored, and finally decoded into the quantized values that were calculated in the encoder. The last step is to convert P and B back to $P_L$ and $P_R$. As easily seen form the definitions of P and B, the reverse relations are (when neglecting e in the definition of B) $P_L=BP/(B+1)$, and $P_R=P/(B+1)$.

One particularly interesting application of the above envelope coding method is coding of highband spectral envelopes for HFR-based codecs. In this case no highband residual signal is transmitted. Instead this residual is derived from the lowband. Thus, there is no strict relation between residual and envelope representation, and envelope quantization is more crucial. In order to study the effects of quantization, let Pq and Bq denote the quantized values of P and B respectively. Pq and Bq are then inserted into the above relations, and the sum is formed:

$P_Lq+P_Rq=BqPq/(Bq+1)+Pq/(Bq+1)=Pq(Bq+1)/(Bq+1)=Pq$. The interesting feature here is that Bq is eliminated, and the error in total power is solely determined by the quantization error in P. This implies that even though B is heavily quantized, the perceived level is correct, assuming that sufficient precision in the quantization of P is used. In other words, distortion in B maps to distortion in space, rather than in level. As long as the sound sources are stationary in the space over time, this distortion in the stereo perspective is also stationary, and hard to notice. As already stated, the quantization of the stereo-balance can also be coarser towards the outer extremes, since a given error in dB corresponds to a smaller error in perceived angle when the angle to the centerline is large, due to properties of human hearing.

When quantizing frequency dependent data e.g., multi band stereo-width gain values or multi band balance values, resolution and range of the quantization method can advantageously be selected to match the properties of a perceptual scale. If such scale is made frequency dependent, different quantization methods, or so called quantization classes, can be chosen for the different frequency bands. The encoded parameter values representing the different frequency bands, should then in some cases, even if having identical values, be interpreted in different ways i.e., be decoded into different values.

Analogous to a switched L/R- to S/D-coding scheme, the P and B signals may be adaptively substituted by the $P_L$ and $P_R$ signals, in order to better cope with extreme signals. As taught by [PCT/SE00/0158], delta coding of envelope samples can be switched from delta-in-time to delta-in-frequency, depending on what direction is most efficient in terms of number of bits at a particular moment. The balance parameter can also take advantage of this scheme: Consider for example a source that moves in stereo field over time. Clearly, this corresponds to a successive change of balance values over time, which depending on the speed of the source versus the update rate of the parameters, may correspond to large delta-in-time values, corresponding to large codewords when employing entropy coding. However, assuming that the source has uniform sound radiation versus frequency, the delta-in-frequency values of the balance parameter are zero at every point in time, again corresponding to small codewords. Thus, a lower bitrate is achieved in this case, when using the frequency delta coding direction. Another example is a source that is stationary in the room, but has a non-uniform radiation. Now the delta-in-frequency values are large, and delta-in-time is the preferred choice.

Figure 4A:
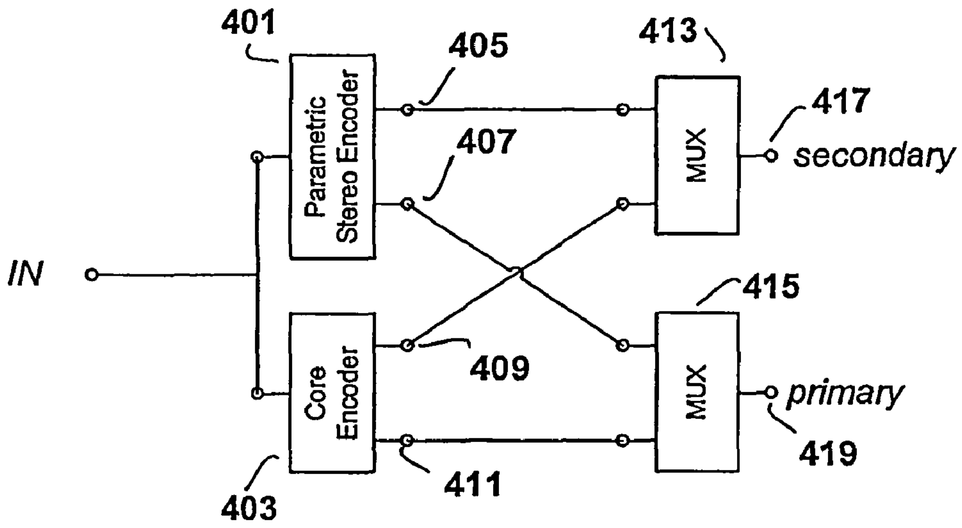
FIG. 4*a* is a block schematic of the encoder side of a scalable HFR-based stereo codec, employing level/balance-coding of the spectral envelope.

The P/B-coding scheme offers the possibility to build a scalable HFR-codec, see FIG. 4. A scalable codec is characterized in that the bitstream is split into two or more parts, where the reception and decoding of higher order parts is optional. The example assumes two bitstream parts, hereinafter referred to as primary, 419, and secondary, 417, but extension to a higher number of parts is clearly possible. The encoder side, FIG. 4*a*, comprises of an arbitrary stereo lowband encoder, 403, which operates on the stereo input signal, IN (the trivial steps of AD-respective DA-conversion are not shown in the figure), a parametric stereo encoder, which estimates the highband spectral envelope, and optionally additional stereo parameters, 401, which also operates on the stereo input signal, and two multiplexers, 415 and 413, for the primary and secondary bitstreams respectively. In this application, the highband envelope coding is locked to P/B-operation, and the P signal, 407, is sent to the primary bitstream by means of 415, whereas the B signal, 405, is sent to the secondary bitstream, by means of 413.

For the lowband codec different possibilities exist: It may constantly operate in S/D-mode, and the S and D signals be sent to primary and secondary bitstreams respectively. In this case, a decoding of the primary bitstream results in a full band mono signal. Of course, this mono signal can be enhanced by parametric stereo methods according to the invention, in which case the stereo-parameter(s) also must be located in the primary bitstream. Another possibility is to feed a stereo coded lowband signal to the primary bitstream, optionally together with highband width- and balance-parameters. Now decoding of the primary bitstream results in true stereo for the lowband, and very realistic pseudo-stereo for the highband, since the stereo properties of the lowband are reflected in the high frequency reconstruction. Stated in another way: Even though the available highband envelope representation or spectral coarse structure is in mono, the synthesized highband residual or spectral fine structure is not. In this type of implementation, the secondary bitstream may contain more lowband information, which when combined with that of the primary bitstream, yields a higher quality lowband reproduction. The topology of FIG. 4 illustrates both cases, since the primary and secondary lowband encoder output signals, 411, and 409, connected to 415 and 417 respectively, may contain either of the above described signal types.

Figure 4B:
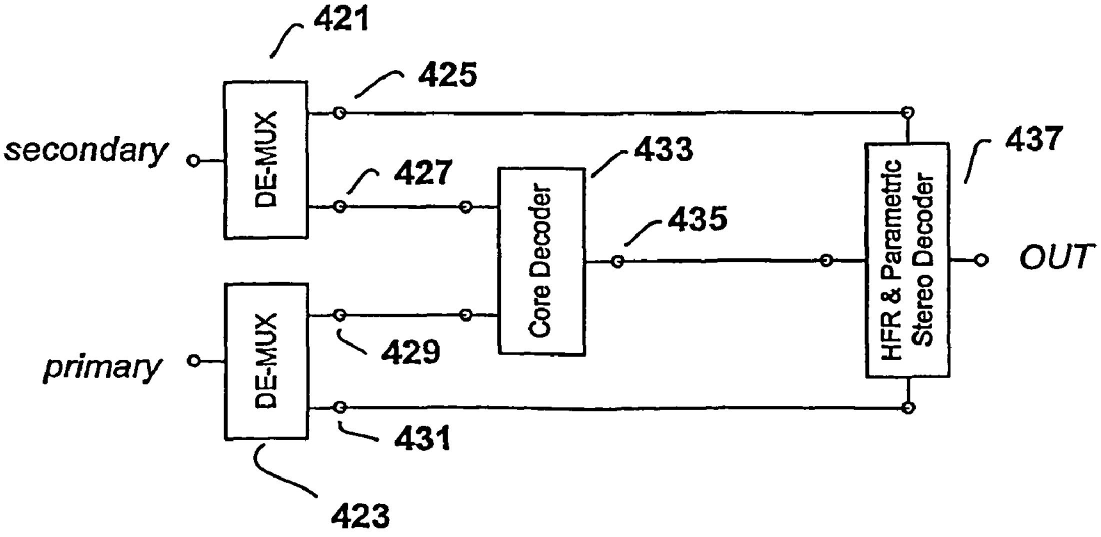
FIG. 4*b* is a block schematic of the corresponding decoder side.

The bitstreams are transmitted or stored, and either only 419 or both 419 and 417 are fed to the decoder, FIG. 4*b*. The primary bitstream is demultiplexed by 423, into the lowband core decoder primary signal, 429 and the P signal, 431. Similarly, the secondary bitstream is demultiplexed by 421, into the lowband core decoder secondary signal, 427, and the B signal, 425. The lowband signal(s) is(are) routed to the lowband decoder, 433, which produces an output, 435, which again, in case of decoding of the primary bitstream only, may be of either type described above (mono or stereo). The signal 435 feeds the HFR-unit, 437, wherein a synthetic highband is generated, and adjusted according to P, which also is connected to the HFR-unit. The decoded lowband is combined with the highband in the HFR-unit, and the lowband and/or highband is optionally enhanced by a pseudo-stereo generator (also situated in the HFR-unit), before finally being fed to the system outputs, forming the output signal, OUT. When the secondary bitstream, 417, is present, the HFR-unit also gets the B signal as an input signal, 425, and 435 is in stereo, whereby the system produces a full stereo output signal, and pseudo-stereo generators if any, are bypassed.

Stated in other words, a method for coding of stereo properties of an input signal, includes at an encoder, the step of calculating a width-parameter that signals a stereo-width of said input signal, and at a decoder, a step of generating a stereo output signal, using said width-parameter to control a stereo-width of said output signal. The method further comprises at said encoder, forming a mono signal from said input signal, wherein, at said decoder, said generation implies a pseudo-stereo method operating on said mono signal. The method further implies splitting of said mono signal into two signals as well as addition of delayed version(s) of said mono signal to said two signals, at level(s) controlled by said width-parameter. The method further includes that said delayed version(s) are high-pass filtered and progressively attenuated at higher frequencies prior to being added to said two signals. The method further includes that said width-parameter is a vector, and the elements of said vector correspond to separate frequency bands. The method further includes that if said input signal is of type dual mono, said output signal is also of type dual mono.

A method for coding of stereo properties of an input signal, includes at an encoder, calculating a balance-parameter that signals a stereo-balance of said input signal, and at a decoder, generate a stereo output signal, using said balance-parameter to control a stereo-balance of said output signal.

In this method, at said encoder, a mono signal from said input signal is formed, and at said decoder, said generation implies splitting of said mono signal into two signals, and said control implies adjustment of levels of said two signals. The method further includes that a power for each channel of said input signal is calculated, and said balance-parameter is calculated from a quotient between said powers. The method further includes that said powers and said balance-parameter are vectors where every element corresponds to a specific frequency band. The method further includes that at said decoder it is interpolated between two in time consecutive values of said balance-parameters in a way that the momentary value of the corresponding power of said mono signal controls how steep the momentary interpolation should be. The method further includes that said interpolation method is performed on balance values represented as logarithmic values. The method further includes that said values of balance-parameters are limited to a range between a previous balance value, and a balance value extracted from other balance values by a median filter or other filter process, where said range can be further extended by moving the borders of said range by a certain factor. The method further includes that said method of extracting limiting borders for balance values, is, for a multiband system, frequency dependent. The method further includes that an additional level-parameter is calculated as a vector sum of said powers and sent to said decoder, thereby providing said decoder a representation of a spectral envelope of said input signal. The method further includes that said level-parameter and said balance-parameter adaptively are replaced by said powers. The method further includes that said spectral envelope is used to control a HFR-process in a decoder. The method further includes that said level-parameter is fed into a primary bitstream of a scalable HFR-based stereo codec, and said balance-parameter is fed into a secondary bitstream of said codec. Said mono signal and said width-parameter are fed into said primary bitstream. Furthermore, said width-parameters are processed by a function that gives smaller values for a balance value that corresponds to a balance position further from the center position. The method further includes that a quantization of said balance-parameter employs smaller quantization steps around a center position and larger steps towards outer positions. The method further includes that said width-parameters and said balance-parameters are quantized using a quantization method in terms of resolution and range which, for a multiband system, is frequency dependent. The method further includes that said balance-parameter adaptively is delta-coded either in time or in frequency. The method further includes that said input signal is passed though a Hilbert transformer prior to forming said mono signal.

An apparatus for parametric stereo coding, includes, at an encoder, means for calculation of a width-parameter that signals a stereo-width of an input signal, and means for forming a mono signal from said input signal, and, at a decoder, means for generating a stereo output signal from said mono signal, using said width-parameter to control a stereo-width of said output signal.

The invention claimed is:

1. Parametric decoder for generating a stereo or multi-channel output signal from a decoder input signal, the decoder input signal comprising;

stereo-width parameters representing degrees of similarity between a first channel and a second channel of a stereo signal or of a multi-channel signal, the parametric decoder comprising:

a calculator for calculating a smoothed stereo-width gain value by smoothing stereo-width gain values over a time segment having several stereo-width parameters, a stereo-width gain value being a function of a corresponding stereo-width parameter; and a generator for generating the stereo or multi-channel output signal using the smoothed stereo width gain value to control a stereo-width of the stereo or multi-channel output signal.

2. The parametric decoder in accordance with claim 1, in which the calculator comprises a smoothing filter, the smoothing filter having a first attack time constant to get a first rise-time and having a second release time constant to get a second fall-time, wherein the first attack time constant is shorter than the second release time constant, and wherein the first rise-time is shorter than the second fall-time.

3. The parametric decoder in accordance with claim 2, further comprising:

a receiver for receiving a signalling of a sudden speech entry and bypassing or resetting the smoothing filter when a sudden speech entry is signalled.

4. The parametric decoder in accordance with claim 2, further comprising:

a receiver for receiving a signalling of attack time constants, release time constants or other filter characteristics of the smoothing filter, the signalling being generated by an encoder.

5. Method of parametric decoding for generating a stereo or multi-channel output signal from a decoder input signal, the decoder input signal comprising stereo-width parameters representing a degree of similarity between a first channel and a second channel of a stereo signal or of a multi-channel signal, the method comprising:

calculating, by a calculator, a smoothed stereo width gain value by smoothing stereo-width gain values over a time segment having several stereo-width parameters, a stereo-width gain value being a function of a corresponding stereo-width parameter; and generating, by a generator, the stereo or multi-channel output signal using the smoothed stereo width gain value to control a stereo-width of the stereo or multi-channel output signal.

6. A pseudo stereo or multi-channel generator for generating a stereo or multi-channel output signal, comprising:

a calculator for calculating a smoothed stereo-width gain by smoothing stereo-width gain values over a time segment having several stereo-width parameters, a stereo-width gain value being a function of a corresponding stereo-width parameter, the stereo-width parameters representing degrees of similarity between a first channel and a second channel of a stereo signal or of a multi-channel signal;

a gain device for applying the smoothed stereo width gain to a mono signal derived from a first channel and a second channel of a stereo signal or a multi-channel signal; and an attenuation device for applying an attenuation to the mono signal, the attenuation being such that an overall level value when changing a stereo width is not significantly altered.

7. Method of pseudo stereo or multi-channel generating a stereo or multi-channel output signal, comprising:

calculating, by a calculator, a smoothed stereo-width gain by smoothing stereo-width gain values over a time segment having several stereo-width parameters, a stereo-width gain value being a function of a corresponding stereo-width parameter, the stereo-width parameters representing degrees of similarity between a first channel and a second channel of a stereo signal or of a multi-channel signal;

applying, by a gain device, the smoothed stereo width gain to a mono signal derived from a first channel and a second channel of a stereo signal or a multi-channel signal; and applying, by an attenuation device, an attenuation to the mono signal, the attenuation being such that an overall level value when changing a stereo width is not significantly altered.

* * * * *